United States Patent [19]

Schroeder et al.

[11] Patent Number: 4,742,332
[45] Date of Patent: May 3, 1988

[54] MAGNETIC SHAFT ANGLE ENCODER

[75] Inventors: Thaddeus Schroeder, Rochester Hills; Harry J. Bauer, Troy; Jack H. Beard, Sterling Heights, all of Mich.

[73] Assignee: General Motors Corporation, Detroit, Mich.

[21] Appl. No.: 37,216

[22] Filed: Apr. 10, 1987

[51] Int. Cl.$^4$ .............................................. H03M 1/64
[52] U.S. Cl. .................................................. 340/347 P
[58] Field of Search ..................................... 340/347 P

[56] References Cited

U.S. PATENT DOCUMENTS

| | | | |
|---|---|---|---|
| 2,556,471 | 6/1951 | Elam | 171/209 |
| 3,456,097 | 7/1969 | Hini | 235/92 |
| 3,930,201 | 12/1975 | Ackermann et al. | 328/1 |
| 4,305,072 | 12/1981 | Makita | 340/870.31 |
| 4,528,471 | 7/1985 | Baumann | 310/11 |

Primary Examiner—William M. Shoop, Jr.
Assistant Examiner—Richard K. Blum
Attorney, Agent, or Firm—Warren D. Hill

[57] ABSTRACT

A magnetic shaft angle encoder uses a gear or toothed wheel for inducing periodic electrical pulses in an inductive pickup. The teeth are evenly spaced and every tooth generates a signal as it passes the pickup. A reference tooth is slightly shorter than the others so that the period of the pulse it generates is shorter than the others and is easily detected to obtain an accurate shaft index position. Since a pulse is produced for every tooth, the pulses provide an excellent means of instantaneous speed sensing.

5 Claims, 2 Drawing Sheets

MAGNETIC SHAFT ANGLE ENCODER

FIELD OF THE INVENTION

This invention relates to a magnetic shaft angle encoder and particularly to such an encoder which provides accurate reference position information.

BACKGROUND OF THE INVENTION

Frequently, as in the case of automotive engine control, it is desirable to monitor the rotation of a shaft to measure parameters such as instantaneous shaft speed and absolute shaft position. Considerable speed variation can occur during each engine revolution and speed measurements on a tooth by tooth basis are important. It is preferred to utilize an existing ring gear having teeth used for meshing with another gear driven by a starter motor but usable as well for an angle encoder.

It is well known to measure the position of a shaft by sensing the teeth of a toothed wheel driven by the shaft to identify incremental shaft movement and to provide a reference mark corresponding to a shaft index position. A magnetic pickup adjacent the path of the teeth generates a generally sinusoidal electrical pulse for each passing tooth. Often the pulses are converted to square wave pulses for digital circuit analysis or pulse counting. To establish a reference or index position on the toothed wheel a separate tooth or notch and pickup are sometimes provided. Another strategy for developing a reference mark is to alter or omit a tooth to cause an extra pulse or a missed pulse which identifies the index position. Each of these latter arrangements spoils the pulse train for use as a speed sensor since a missed pulse or extra pulse would cause an aberration in speed measurement.

FIG. 1 shows a prior art system identified in Baumann U.S. Pat. No. 4,528,471 wherein a missing tooth causes a wide swing in the amplitude of an inductive pickup signal. When a zero crossing detector is used to develop a square wave several teeth go undetected so that the train of pulses are severely interrupted and a wide square wave pulse of unpredictable duration tu is produced, so that the position of the missing tooth is only imprecisely located The solution to that problem offered in the Baumann patent is shown in FIG. 2 There, a portion of each tooth top for two or three adjacent teeth is carved out so that each tooth maintains its mechanical usefulness but it appears to the pickup that one tooth is missing. In this case the signal is much less distorted than in FIG. 1, and one square wave pulse is skipped to yield a wide pulse $t_b$. The reference point is still imprecise and the lost pulse causes a speed measurement error.

SUMMARY OF THE INVENTION

It is therefore an object of the invention to provide an shaft angle encoder using a toothed member with all teeth intact, producing a pulse for every tooth to attain reliable speed measurements, and having a precise reference position. It is a further object to provide such an encoder having minimal alteration of a reference tooth.

The invention is carried out by a magnetic shaft angle encoder comprising; a toothed wheel driven by a shaft, the wheel having a plurality of standard teeth and at least one reference tooth, an inductive pickup adjacent the wheel for emitting an electrical pulse for each standard and reference tooth, the pulse width being dependent on relative tooth size of neighboring teeth, the standard teeth of the wheel having sufficiently equal size to produce equal width pulses and the reference tooth having a different size to yield different pulse widths for the reference tooth and adjacent standard teeth, and electrical means for registering all the pulses to track shaft angle and for analyzing the pulses to detect the reference tooth and identify an index point thereby establishing the rotational position of the shaft.

BRIEF DESCRIPTION OF THE DRAWINGS

The above and other advantages of the invention will become more apparent from the following description taken in conjunction with the accompanying drawings wherein like reference numerals refer to like parts and wherein.

DESCRIPTION OF THE PREFERRED EMBODIMENT

A ring gear 10 driven by a shaft, not shown, has a plurality of standard teeth 12 and one reference tooth 12R for meshing with another gear. If more than one index position on the wheel is to be identified, then more than one reference tooth can be used. The teeth are evenly spaced and have uniform height except for the reference tooth 12R which is slightly shorter than the others. The reference tooth is flat on top, like the standard teeth, and is easily formed by a machining operation.

Figure 4:
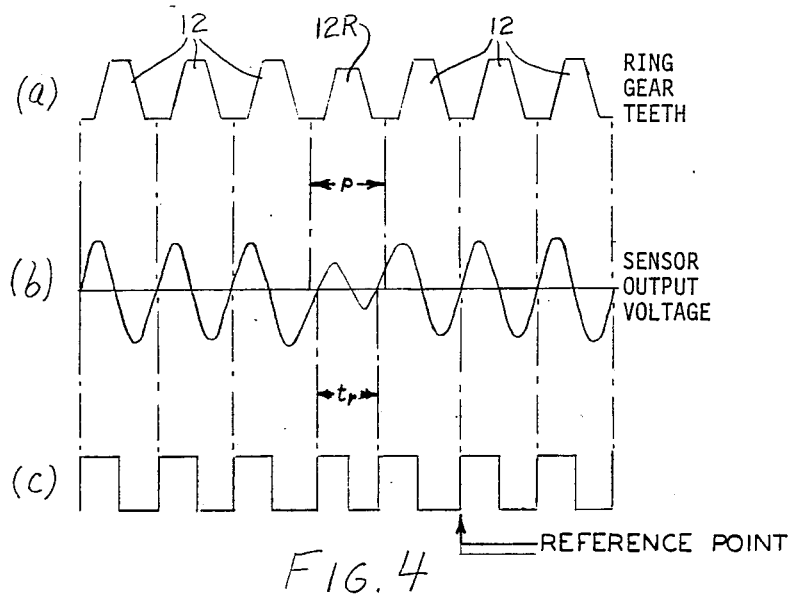

An inductive pickup 14 is positioned close to the path of the teeth to sense every tooth as the gear rotates. As shown in FIG. 4 the pickup generates a nearly sinusoidal signal which undergoes a zero crossing twice for every tooth. The pickup 14 is coupled to a zero crossing detector 16 which generates a square wave for each passing tooth. It is essential that a square wave is produced for every tooth. This is accomplished by positioning the pickup 14 one to three millimeters from the path of the standard teeth 12, and making the reference tooth 12R 0.1 to 0.5 mm shorter than the standard teeth 12. In a typical ring gear having about 97 to 142 teeth and each tooth being about 5 mm high, this range of dimensions is easily accommodated in practice and thus results in a practical design for a manufactured product.

The signal produced by the reference tooth 12R has a shorter period (or greater speed value) than the average of all the teeth even though the mechanical tooth spacing or pitch p is the same for all teeth. The shorter tooth results in a larger tooth-to-pickup air gap and thus yields a lower amplitude signal which effectively reduces the period between zero crossings. As seen in FIG. 4, the shorter period $t_r$ for the reference tooth results in a longer period for the two neighboring teeth. This pattern of long-short-long periods or low-high-low speed values is useful to detect the reference tooth even when the differences are small. Usually, however the tooth design described above yields a period 15% to 35% shorter than the average and is easily detected. The signal shown in FIG. 4 resulted from a test with a reference tooth 12R 0.5 mm shorter than the standard teeth which yielded speed values of:

| RPM | TOOTH |
|---|---|
| 3484 | 12 |
| 3488 | 12 |
| 3291 | 12 |
| 4127 | 12R |
| 3271 | 12 |
| 3473 | 12 |
| 3487 | 12. |

For this data set, the average speed is 3517 rpm, the value 4127 is about 17% higher than the average and the values neighboring the high value are about 7% lower than the average.

Figures 1, 2:
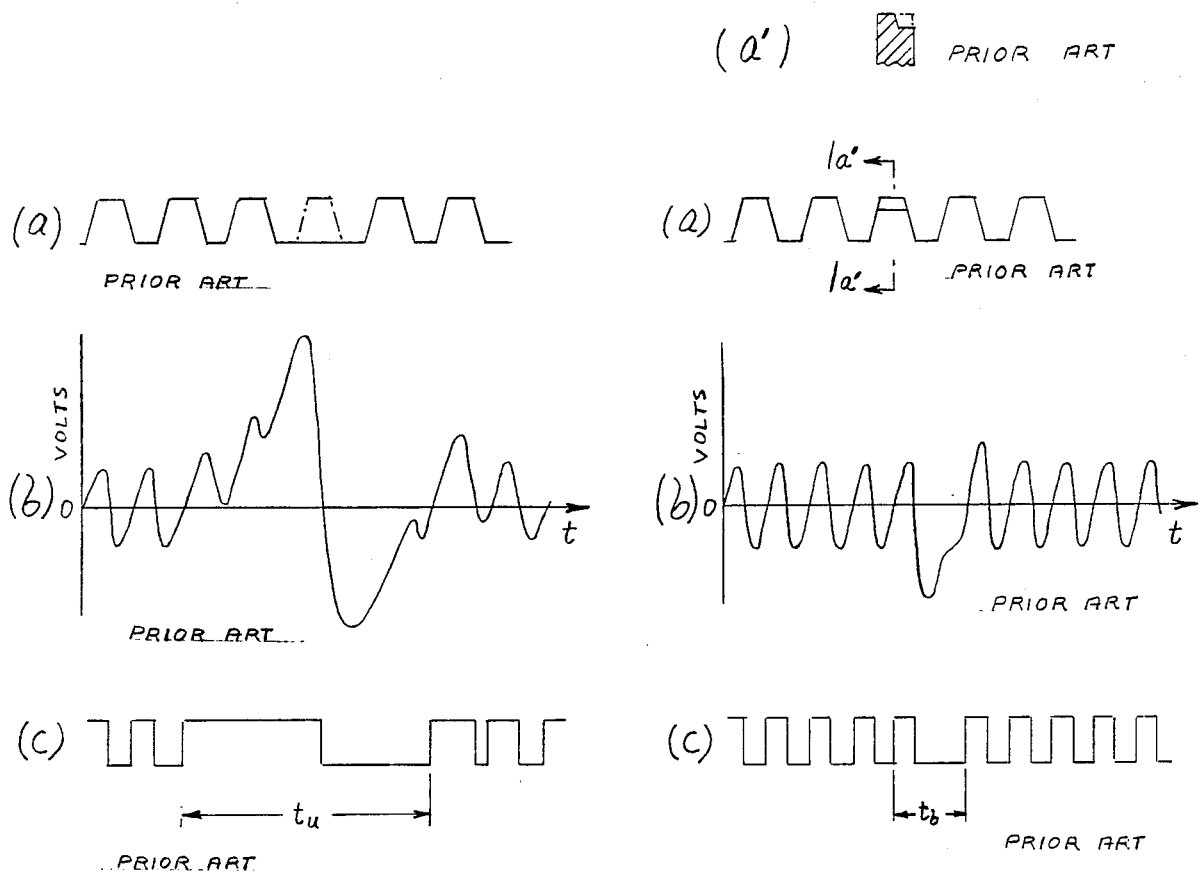
FIG. 1, parts (a), (b) and (c) are respectively a diagram of a prior art toothed encoder wheel pattern and the resulting waveforms, FIG. 2, parts (a), (b) and (c) are respectively a diagram of another prior art toothed encoder wheel pattern and the resulting waveforms, and part (a') is a cross-sectional view of a tooth taken along line a'—a' of part (a)
Figure 3:
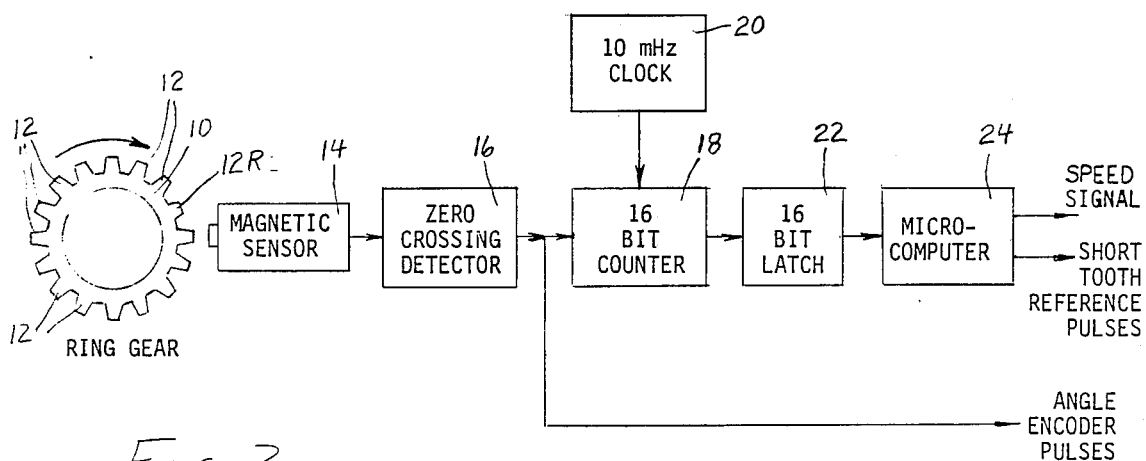
FIG. 3 is a schematic diagram of a shaft angle encoder and circuit according to the invention, FIG. 4, parts (a), (b) and (c) are respectively a diagram of a toothed encoder wheel according to the invention and the resulting waveforms.
Figure 5:
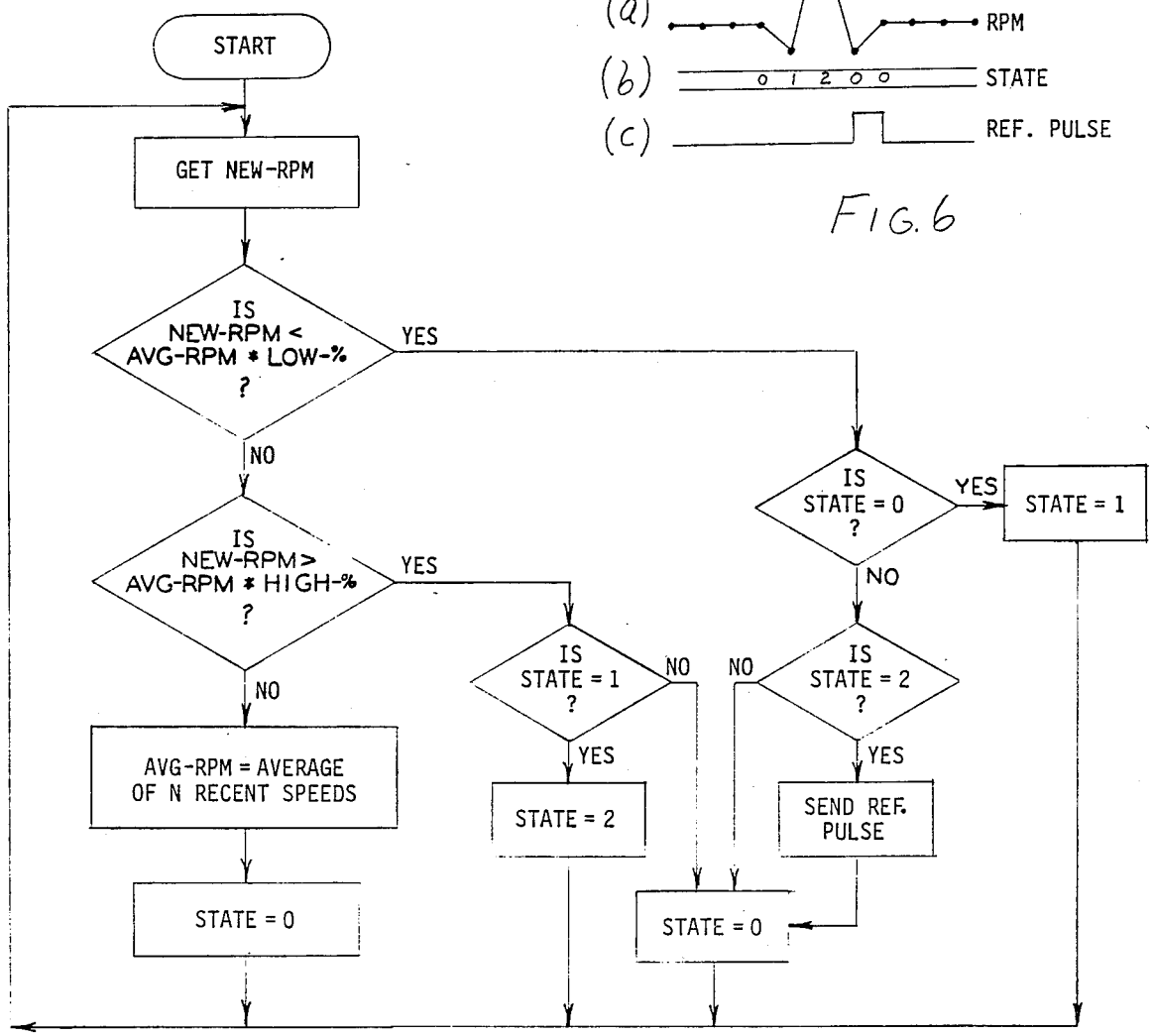
FIG. 5 is a flow chart describing a program for the microprocessor of FIG. 3, and FIG. 6, parts (a), (b) and (c) are respectively an analog representation of the speed values input to the microprocessor, a microprocessor flag state for each speed value, and the output reference pulse.

The circuit of FIG. 3 includes a counter 18 which counts clock pulses from a 10 MHz clock 20 and is triggered by the square wave pulses from the zero crossing detector 16 to yield a digital value proportional to each tooth period. The counter 18 output is stored by a latch 22 at the end of each period. A microcomputer 24 reads and operates on the stored value for each period to produce a speed signal and a reference pulse. The microcomputer is programmed according to the flow chart of FIG. 5.

Figure 6:
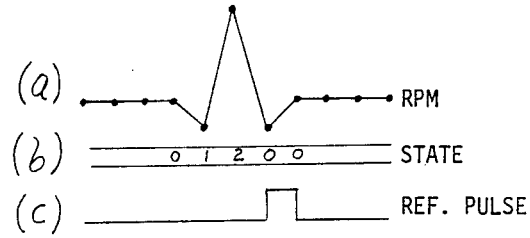

The algorithm expressed in the flow chart analyzes the speed data and detects the pattern or "LOW—HIGH—LOW" signature shown in FIG. 6, where the short tooth produces a low rpm value followed by a high value and then another low value. The detection of the first low value sets a flag to a "1" state. The subsequent detection of the high value sets a "2" state, and the subsequent detection of the second low value causes the reference pulse to issue. Average values and the reference pulse result in a "0" state. The microcomputer determines speed values from the period values. Each new speed value, "NEW-RPM", is compared to a moving average speed reduced by a preset multiplier, "LOW-%". If NEW-RPM is less than the "reduced average" and the previous state was "0", the state is set at "1", but if the previous state was "2" a reference pulse is issued and the state is reset to "0". If the NEW-RPM is greater than the average speed increased by a "HIGH-%" and the previous state was "1", then the state is set to "2", otherwise the state is reset to "0". Finally a new moving average is calculated from the last N normal speed values (not identified as either high or low values) and the state set to "0". In practice, typical values for the algorithm used on a diesel engine control application were LOW-%=0.96, HIGH-%=1.1, and N=5.

The use of this algorithm results in the easy detection of the reference tooth, although the reference pulse or index position is not set at the position of the reference tooth but rather it occurs at the end of the signature verification which is at the rising edge of the pulse for the second tooth following the reference tooth, as indicated on FIG. 4(c). At that point the pulse width disturbance caused by the reference tooth is very small so that the index point is precisely located.

Where the reference pulse speed value is sufficiently high, say 20% above the average, only the high value need be detected instead of detecting the LOW - HIGH - LOW signature. In that event, the reference tooth is verified sooner but in the interest of precision the determination of the index point can, if desired, be fixed by the rising pulse of the following tooth.

It will thus be seen that the encoder according to this invention provides accurate detection of an index position of a shaft or other rotary member while allowing accurate speed sensing from the same signals that are used for angle encoding. Even where radial runout of the toothed wheel occurs the quality of the encoder signals are not diminished since the signal from each tooth is compared with signals from one or more neighboring teeth which will be similarly affected by runout. In addition, maximum tooth integrity is obtained since only the uttermost top of the reference tooth is reduced and the reduction is small.

The embodiments of the invention in which an exclusive property or privilege is claimed are defined as follows:

1. A magnetic shaft angle encoder comprising;
   a toothed wheel driven by a shaft, the wheel having a plurality of standard teeth and at least one reference tooth,
   an inductive pickup adjacent the wheel for emitting an electrical pulse for each standard and reference tooth, the pulse width being dependent on relative tooth size of neighboring teeth,
   the standard teeth of the wheel having sufficiently equal size to produce equal width pulses and the reference tooth having a different size to yield different pulse widths for the reference tooth and adjacent standard teeth, and
   electrical means for registering all the pulses to track shaft angle and for analyzing the pulses to detect the reference tooth and identify an index point thereby establishing the rotational position of the shaft,
   said electrical means comprising microprocessor means programmed to convert the pulse widths to a shaft speed value for each tooth, calculate a moving average of several recent speed values, compare each new value to the average speed value to detect high and low values, and identify the pattern of low, high, and then low speeds for sequential teeth to detect the reference tooth and determine an index point, thereby establishing the rotational position of the shaft.

2. A magnetic shaft angle encoder comprising;
   a toothed wheel driven by a shaft, the wheel having a plurality of standard teeth and at least one reference tooth,
   an inductive pickup adjacent the wheel for emitting an electrical pulse for each standard and reference tooth, the pulse width being dependent on relative tooth-to-pickup gap of neighboring teeth as determined by relative tooth sizes,
   the standard teeth of the wheel having sufficiently equal size to produce equal width pulses and the reference tooth having a smaller size to yield a smaller pulse width for the reference tooth and larger pulse widths for the adjacent standard teeth, and electrical means for registering all the pulses to track shaft angle and for analyzing the pulse widths to detect the reference tooth and to identify the position of an index point thereby establishing the rotational position of the shaft.

3. An encoder as defined in claim 2 wherein the electrical means for analyzing the pulse widths identifies the pattern of large, small, and then large pulse widths to detect the reference tooth and determine an index point, thereby establishing the rotational position of the shaft.

4. An encoder as defined in claim 2 wherein the electrical means for analyzing the pulse widths converts the pulse widths to shaft speed values and identifies the pattern of low, high, and then low speeds for sequential teeth to detect the reference tooth and determine an index point, thereby establishing the rotational position of the shaft.

5. An encoder as defined in claim 2 wherein the electrical means for analyzing the pulse widths includes microprocessor means programmed to convert the pulse widths to a shaft speed value for each tooth, calculate a moving average of several recent speed values, compare each new value to the average speed value to detect high and low values, and identify the pattern of low, high, and then low speeds for sequential teeth to detect the reference tooth and determine an index point, thereby establishing the rotational position of the shaft.

* * * * *